US012787254B2

(12) United States Patent
Shao et al.

(10) Patent No.: US 12,787,254 B2
(45) Date of Patent: Nov. 3, 2026

(54) SEMICONDUCTOR STRUCTURE AND MANUFACTURING METHOD THEREOF

(71) Applicants: CHANGXIN MEMORY TECHNOLOGIES, INC., Hefei City (CN); BEIJING SUPERSTRING ACADEMY OF MEMORY TECHNOLOGY, Beijing (CN)

(72) Inventors: Guangsu Shao, Hefei City (CN); Deyuan Xiao, Hefei City (CN); Yunsong Qiu, Hefei City (CN); Mengkang Yu, Hefei City (CN)

(73) Assignees: CHANGXIN MEMORY TECHNOLOGIES, INC., Hefei City (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 1163 days.

(21) Appl. No.: 17/809,667

(22) Filed: Jun. 29, 2022

(65) Prior Publication Data

US 2023/0171951 A1 Jun. 1, 2023

Related U.S. Application Data

(63) Continuation of application No. PCT/CN2022/089243, filed on Apr. 26, 2022.

(30) Foreign Application Priority Data

Nov. 30, 2021 (CN) ........................ 202111442530.8

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC .............................. H10B 12/053; H10B 12/34
See application file for complete search history.

(56) References Cited

U.S. PATENT DOCUMENTS

2011/0045643 A1 2/2011 Yoon et al.
2015/0214231 A1 7/2015 Lee
(Continued)

FOREIGN PATENT DOCUMENTS

CN 102522407 A 6/2012
CN 108933136 A 12/2018
(Continued)

OTHER PUBLICATIONS

International Search Report cited in PCT/CN2022/089243 mailed Jul. 28, 2022, 9 pages.

*Primary Examiner* — Mark V Prenty
(74) *Attorney, Agent, or Firm* — Syncoda LLC; Feng Ma

(57) ABSTRACT

The present disclosure provides a semiconductor structure and a manufacturing method thereof, and relates to the technical field of semiconductors. The semiconductor structure includes a plurality of active pillars, a dielectric layer that is disposed around a circumference of the active pillar and that covers a part of a sidewall of the active pillar, and a word line. Any two adjacent ones of the plurality of active pillars are separated by using a first trench or a second trench. The first trench and the second trench are staggered. The second trench is wider than the first trench. The dielectric layer is disposed around the circumference of the active pillars. The word line partially covers the dielectric layer, and fills a part of the first trench located between adjacent active pillars.

11 Claims, 17 Drawing Sheets

(56) References Cited

U.S. PATENT DOCUMENTS

| | | | | |
|---|---|---|---|---|
| 2021/0351182 | A1 | 11/2021 | Yang et al. | |
| 2023/0171951 | A1* | 6/2023 | Shao | H10B 12/053<br>257/296 |

FOREIGN PATENT DOCUMENTS

| | | | |
|---|---|---|---|
| CN | 110896074 | A | 3/2020 |
| CN | 113066794 | A | 7/2021 |
| CN | 113629011 | A | 11/2021 |
| CN | 113629056 | A | 11/2021 |

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/089243, filed on Apr. 26, 2022, which claims the priority to Chinese Patent Application 202111442530.8, titled "SEMICONDUCTOR STRUCTURE AND MANUFACTURING METHOD THEREOF" and filed on Nov. 30, 2021. The entire contents of International Application No. PCT/CN2022/089243 and Chinese Patent Application 202111442530.8 are incorporated herein by reference.

TECHNICAL FIELD

The present disclosure relates to, but is not limited to, a semiconductor structure and a manufacturing method thereof.

BACKGROUND

As the integration of the semiconductor memory device increases, and its feature size is miniaturized, the challenge to the manufacturing process of the memory becomes higher. The control accuracy of the manufacturing process affects the yield and reliability of the product. In the semiconductor manufacturing process, a material is usually used to fill a trench, and then the filled material is etched using a mask. The process is complicated and difficult to control.

SUMMARY

An overview of the subject matter detailed in the present disclosure is provided below, which is not intended to limit the protection scope of the claims.

The present disclosure provides a semiconductor structure and a manufacturing method thereof.

A first aspect of the present disclosure provides a semiconductor structure, including:

- a plurality of active pillars, where any two adjacent ones of the plurality of active pillars are separated by using a first trench or a second trench, the first trench and the second trench are staggered, and the second trench is wider than the first trench;
- a dielectric layer, where the dielectric layer is disposed around a circumference of the active pillar; and
- a word line, where the word line extends along an extension direction of the second trench, and the word line partially covers the dielectric layer, and fills a part of the first trench located between adjacent active pillars.

A second aspect of the present disclosure provides a method of manufacturing a semiconductor structure, including:

- providing a plurality of active pillars, where any two adjacent ones of the plurality of active pillars are separated by using a first trench or a second trench, the first trench and the second trench are staggered, and the second trench is wider than the first trench;
- forming a dielectric layer, where the dielectric layer is disposed around a circumference of the active pillar; and
- forming a word line extending along an extension direction of the second trench, where the word line covers the dielectric layer, and fills a part of the first trench located between adjacent active pillars.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

Figure 1A:
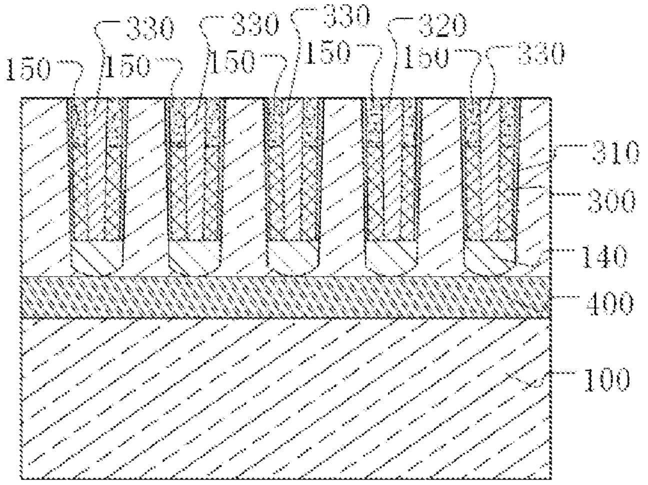
FIG. 1*a* is a cross-sectional view of a semiconductor structure taken along A-A according to an exemplary embodiment.
Figure 1B:
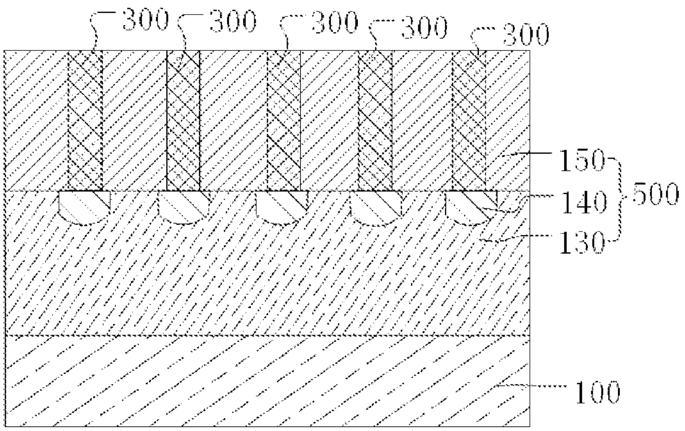
FIG. 1*b* is a cross-sectional view of the semiconductor structure taken along B-B according to an exemplary embodiment.

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The semiconductor structure is not limited in this embodiment. The semiconductor structure is described below by taking a dynamic random access memory (DRAM) as an example, but this embodiment is not limited to this, and the semiconductor structure in this embodiment may also be other structures.

As shown in FIGS. 1*a* to 1*d* and 2, an exemplary embodiment of the present disclosure provides a semiconductor structure, including: a plurality of active pillars 200, a dielectric layer 310 that is disposed around a circumference of the active pillar 200 and that covers a part of a sidewall of the active pillar 200, and a word line 300 partially covering the dielectric layer 310. Any two adjacent ones of the plurality of active pillars 200 are separated by using a first trench 110 or a second trench 120, the first trench 110 and the second trench 120 are staggered, and the second trench 120 is wider than the first trench 110. The word line 300 extends along an extension direction of the second trench 120. The word line 300 fills a part of the first trench 110 located between adjacent active pillars 200.

In the semiconductor structure of this embodiment, two adjacent word lines 300 are separated by a gap in the second trench 120. The second trench 120 is wider than the first trench 110. A distance between two adjacent word lines 300 is relatively large. Therefore, two adjacent word lines 300 are not conductively connected, which improves the yield and reliability of the semiconductor structure. In this case, the semiconductor structure of this embodiment is suitable for a device structure with a smaller feature size.

In some embodiments, as shown in FIGS. 1*a* to 1*d* and 2, the first trenches 110 extend along the first direction D1 and are arranged at intervals. The second trenches 120 extend along a second direction D2, and are arranged at intervals. The first direction D1 and the second direction D2 form a predetermined angle to intersect. The active pillar 200 is disposed at an intersection of the first trench 110 and the second trench 120. A plurality of active pillars 200 are arranged in an array.

For example, the predetermined angle may be an acute angle, a right angle, or an obtuse angle in a range of, for example, 10° to 140° such as 20°, 50°, 90°, or 120°. In this embodiment, the first direction D1 is perpendicular to the second direction D2. In this case, the plurality of active pillars 200 in this embodiment are arranged in a matrix. The plurality of active pillars 200 are separated by the first trenches 110 in the first direction D1 and separated by the second trenches 120 in the second direction D2.

Figure 1C:
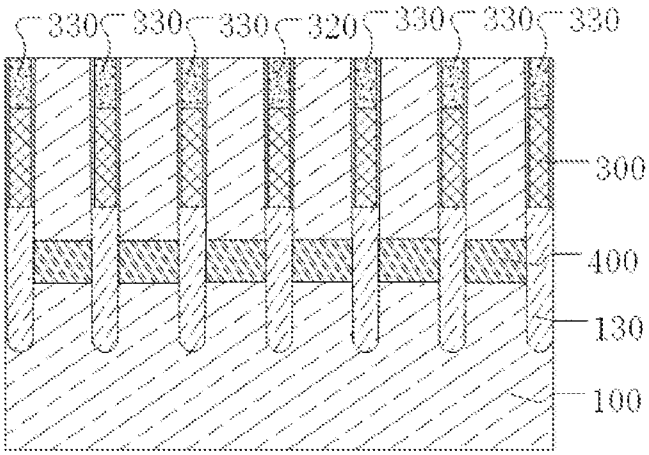
FIG. 1*c* is a cross-sectional view of the semiconductor structure taken along C-C according to an exemplary embodiment.
Figure 1D:
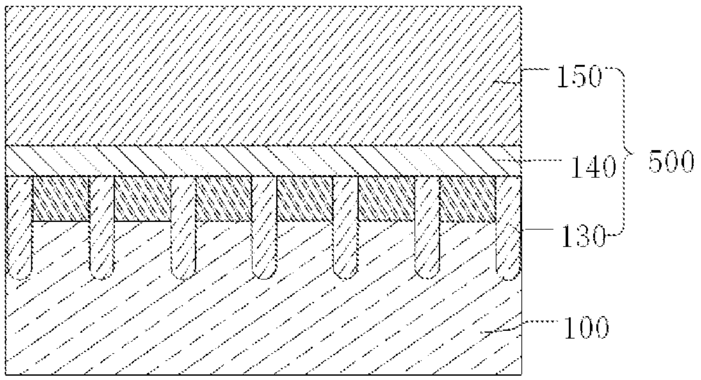
FIG. 1*d* is a cross-sectional view of the semiconductor structure taken along D-D according to an exemplary embodiment.
Figure 2:
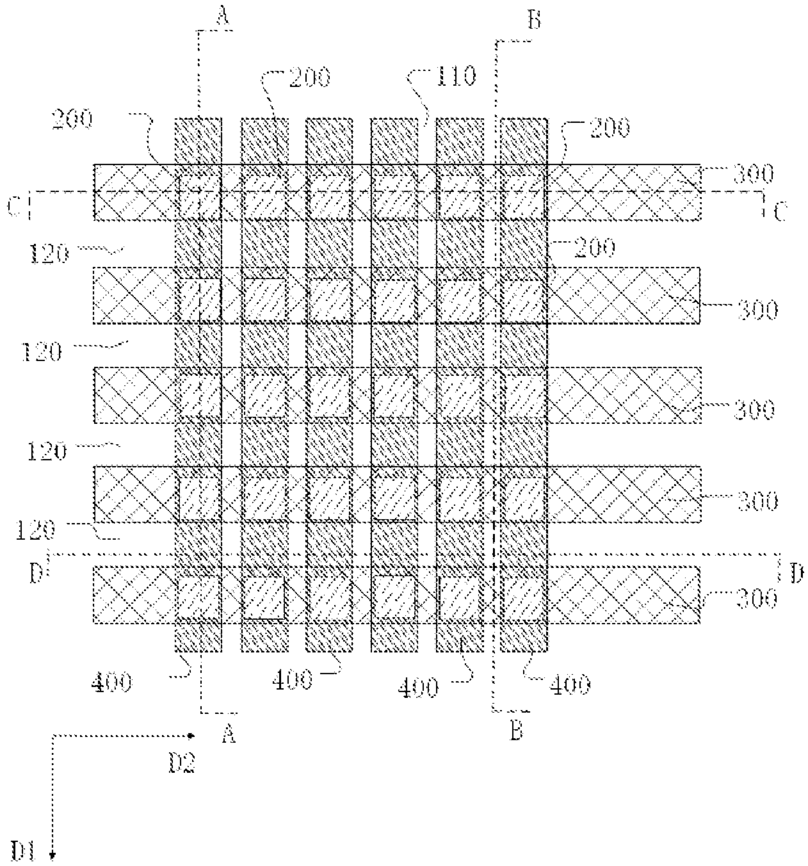
FIG. 2 is a top view of the semiconductor structure according to an exemplary embodiment.

As shown in FIGS. 1*a*, 1*c*, and 2, the semiconductor structure in this embodiment includes a plurality of word lines 300 extending along the second direction D2. Each of the word lines 300 covers partially sidewalls of each row of the active pillars 200 arranged along the second direction. The dielectric layer 310 is disposed between the word line 300 and the active pillar 200.

In some embodiments, as shown in FIGS. 1*a*, 1*c*, and 2, the top surface of the word line 300 is lower than that of the active pillar 200, to avoid that a relatively small spacing between the word lines 300 causes the top surface of the word line 300 to be electrically connected to that of the semiconductor structure, resulting a short circuit, thereby ensuring the electrical performance of the semiconductor structure.

In some embodiments, as shown in FIGS. 1*a*, 1*c*, 15*a*, and 15*c*, the top of the word line 300 is provided with a groove 320. A barrier layer 330 is provided in the groove 320. The barrier layer 330 covers the top surface of the word line 300. The top surface of the barrier layer 330 is flush with that of the active pillar 200. In this embodiment, the word lines 300 are integrally disposed in the semiconductor structure. Adjacent word lines 300 are separated. When the semiconductor structure is connected to another semiconductor device, the another semiconductor device is not directly connected to the word line 300, to avoid that a direct connection between the semiconductor device and the word line 300 causes a short circuit of its adjacent word line 300.

In the semiconductor structure of this embodiment, in some embodiments, as shown in FIGS. 1*a*, 1*c*, 1*d*, and 2, the semiconductor structure further includes a plurality of bit lines 400 extending along the first direction D1. The plurality of bit lines 400 are disposed in the first trenches 110. The bit lines 400 are correspondingly disposed below a row of the active pillars 200 arranged along the first direction D1.

In some embodiments, as shown in FIGS. 1*a* to 1*d*, the semiconductor structure further includes an isolation structure 500. The isolation structure 500 is disposed in the first trench 110 and the second trench 120. The isolation structure 500 fills a gap between adjacent active pillars 200, a gap between adjacent word lines 300, a gap between adjacent bit lines 400, and a gap between the word line 300 and the bit line 400.

In the semiconductor structure of this embodiment, the isolation structure 500 isolates the active pillars 200, word lines 300, and bit lines 400 in the semiconductor structure, to keep the foregoing components in the semiconductor structure independent, and prevent a conductive interference between adjacent components from affecting the electrical property of the semiconductor structure.

In some embodiments, as shown in FIG. 2, a ratio of a width of the second trench 120 to that of the first trench 110 is 1.5 to 5:1 such as 2:1, 3:1, and 4:1. In the foregoing range, when the word lines 300 are formed around the active pillars 200, the first trench 110 is filled faster than the second trench 120, that is, when a conductive metal fills up the first trench 110, a partial region in the second trench 120 is not filled, with a gap. The filling material in the second trench 120 is etched back to form a plurality of word lines 300 arranged independently, reducing the difficulty of forming the word lines 300. Moreover, the second trench 120 is relatively wide, and two adjacent word lines 300 are separated by the gap, and therefore they are not electrically connected, improving the yield and reliability of the semiconductor structure.

An exemplary embodiment of the present disclosure provides a method of manufacturing a semiconductor structure, which is described below with reference to FIGS. 1*a* to 15*d*.

Figure 3:
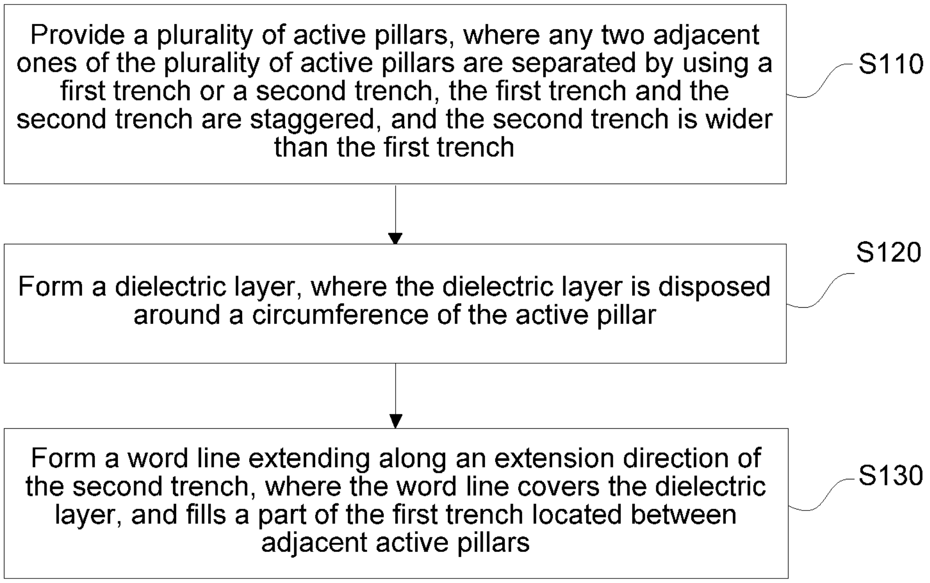
FIG. 3 is a flowchart of a method of manufacturing a semiconductor structure according to an exemplary embodiment.

As shown in FIG. 3, an exemplary embodiment of the present disclosure provides a method of manufacturing a semiconductor structure, including:

step S110: Provide a plurality of active pillars, where any two adjacent ones of the plurality of active pillars are separated by using a first trench or a second trench, the first trench and the second trench are staggered, and the second trench is wider than the first trench.

Figure 6:
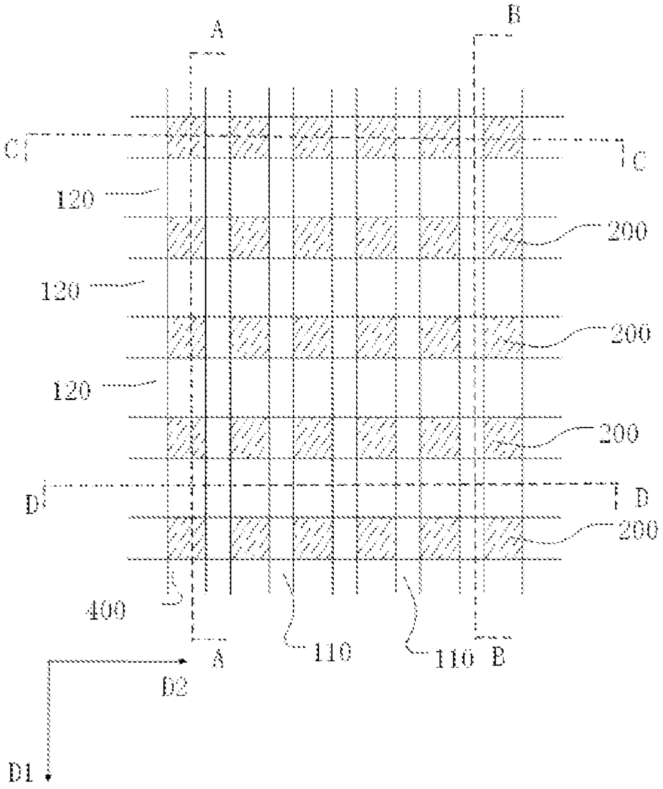
FIG. 6 is a top view of an active pillar according to an exemplary embodiment.
Figure 7A:
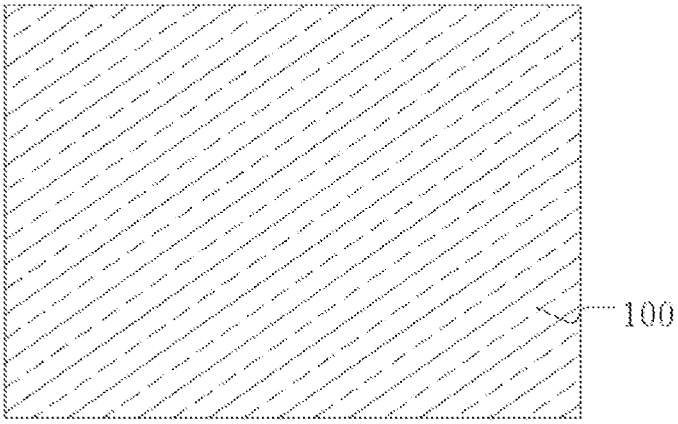
FIG. 7*a* is a cross-sectional view of a first trench formed in a substrate taken along A-A in FIG. 6.
Figure 7B:
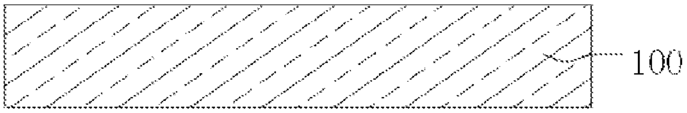
FIG. 7*b* is a cross-sectional view of the first trench formed in the substrate taken along B-B in FIG. 6.
Figure 7C:
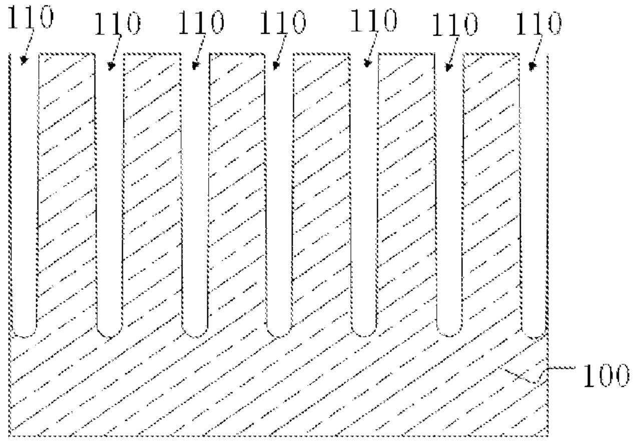
FIG. 7*c* is a cross-sectional view of the first trench formed in the substrate taken along C-C in FIG. 6.
Figure 7D:
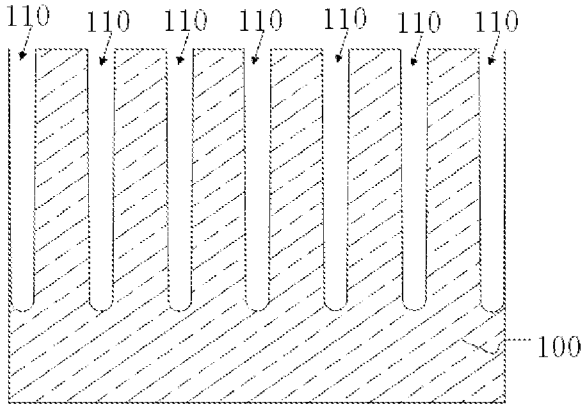
FIG. 7*d* is a cross-sectional view of the first trench formed in the substrate taken along D-D in FIG. 6.
Figure 8A:
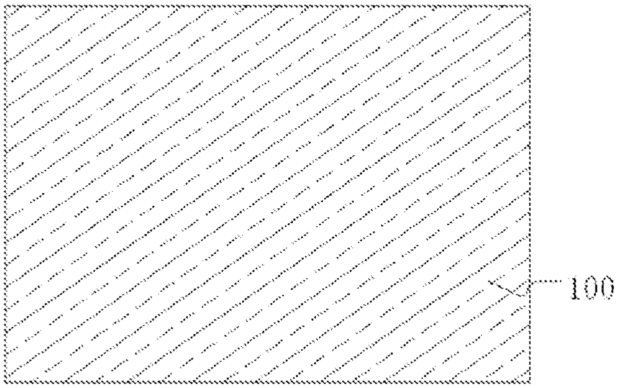
FIG. 8*a* is a cross-sectional view of a first isolation layer formed in the first trench taken along A-A in FIG. 6.
Figure 8B:
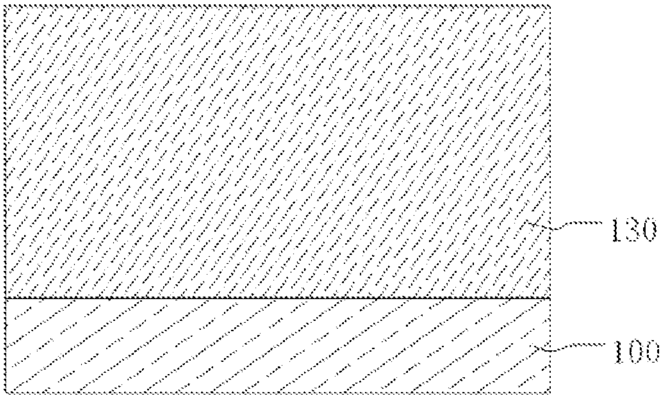
FIG. 8*b* is a cross-sectional view of the first isolation layer formed in the first trench taken along B-B in FIG. 6.
Figure 8C:
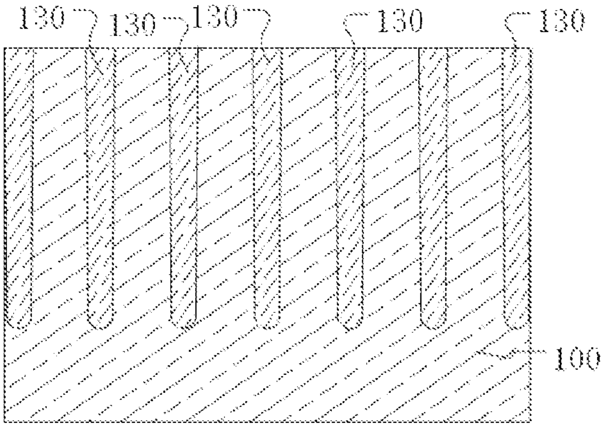
FIG. 8*c* is a cross-sectional view of the first isolation layer formed in the first trench taken along C-C in FIG. 6.
Figure 8D:
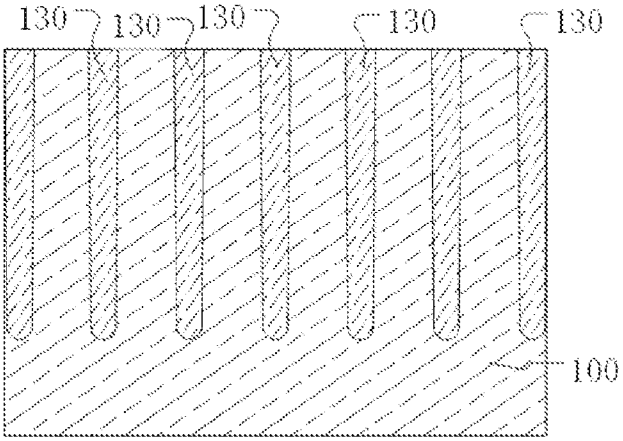
FIG. 8*d* is a cross-sectional view of the first isolation layer formed in the first trench taken along D-D in FIG. 6.
Figure 9A:
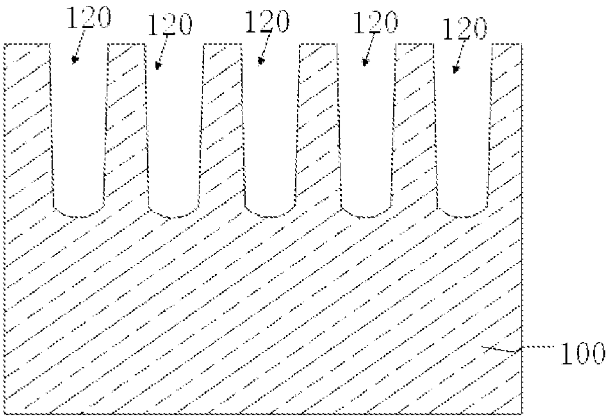
FIG. 9*a* is a cross-sectional view of a second trench formed in the substrate and the first isolation layer taken along A-A in FIG. 6.
Figure 9B:
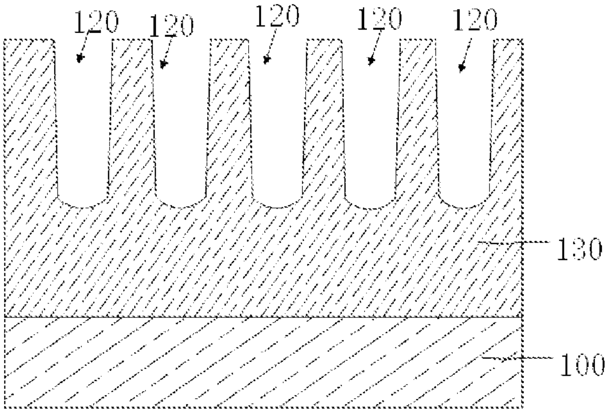
FIG. 9*b* is a cross-sectional view of the second trench formed in the substrate and the first isolation layer taken along B-B in FIG. 6.
Figure 9C:
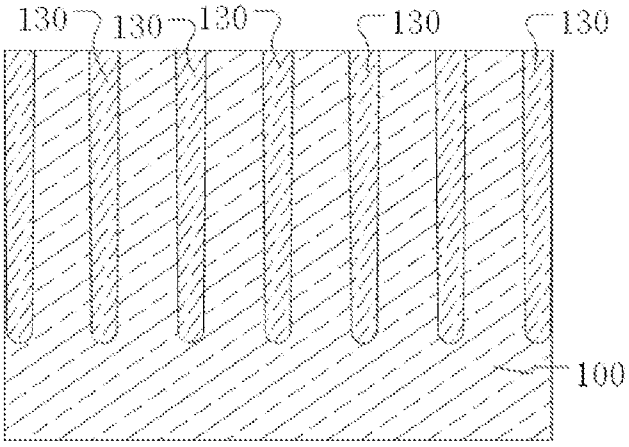
FIG. 9*c* is a cross-sectional view of the second trench formed in the substrate and the first isolation layer taken along C-C in FIG. 6.
Figure 9D:
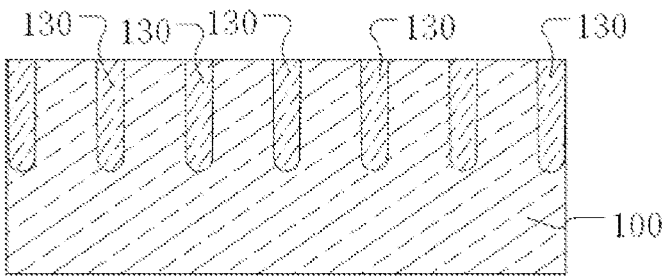
FIG. 9*d* is a cross-sectional view of the second trench formed in the substrate and the first isolation layer taken along D-D in FIG. 6.
Figure 10A:
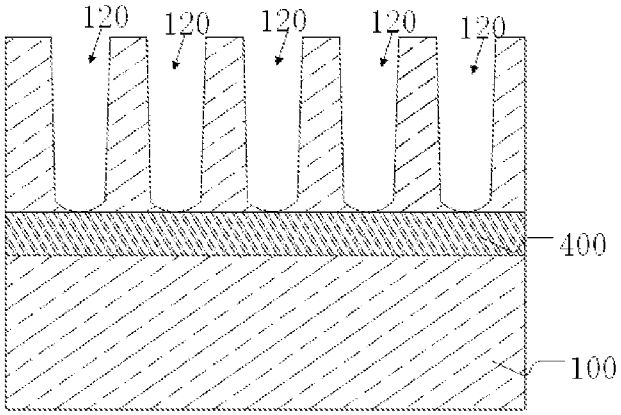
FIG. 10*a* is a cross-sectional view of forming a bit line taken along A-A in FIG. 6.
Figure 10B:
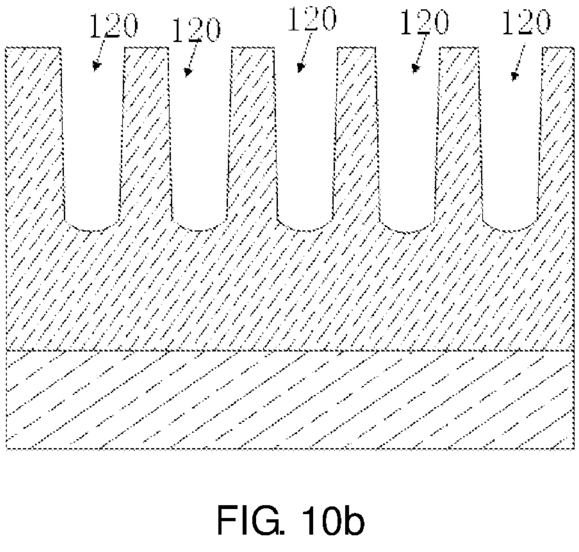
FIG. 10*b* is a cross-sectional view of forming the bit line taken along B-B in FIG. 6.
Figure 10C:
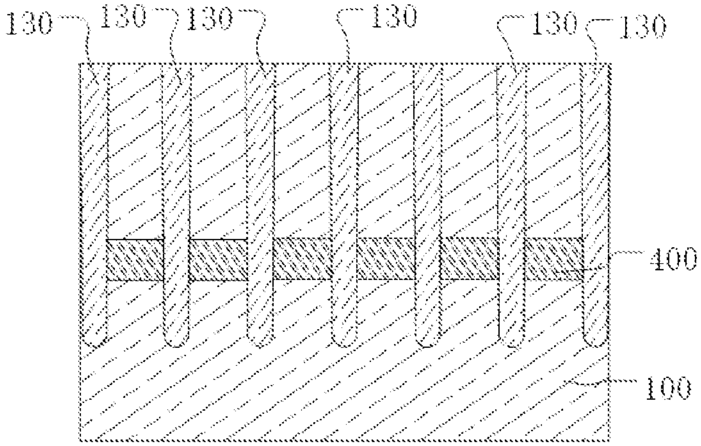
FIG. 10*c* is a cross-sectional view of forming the bit line taken along C-C in FIG. 6.
Figure 10D:
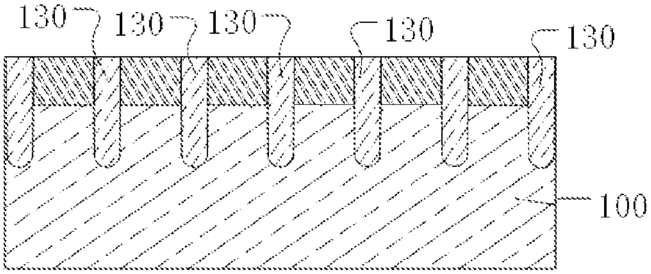
FIG. 10*d* is a cross-sectional view of forming the bit line taken along D-D in FIG. 6.
Figure 11A:
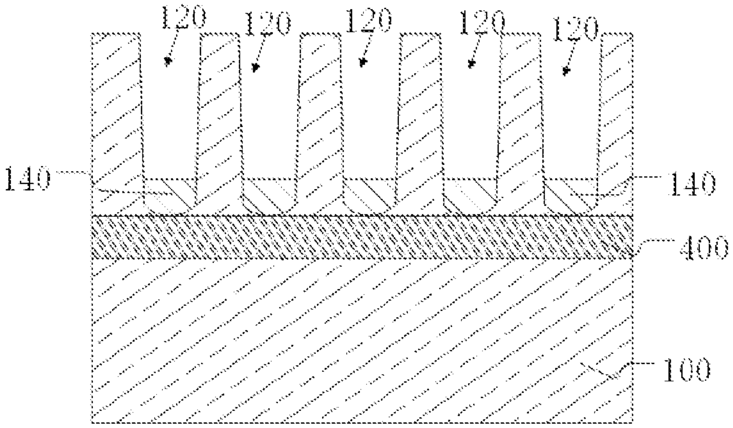
FIG. 11*a* is a cross-sectional view of forming a second isolation layer taken along A-A in FIG. 6.
Figure 11B:
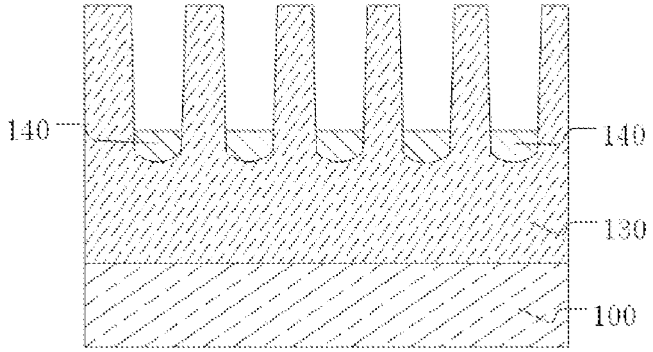
FIG. 11*b* is a cross-sectional view of forming the second isolation layer taken along B-B in FIG. 6.
Figure 11C:
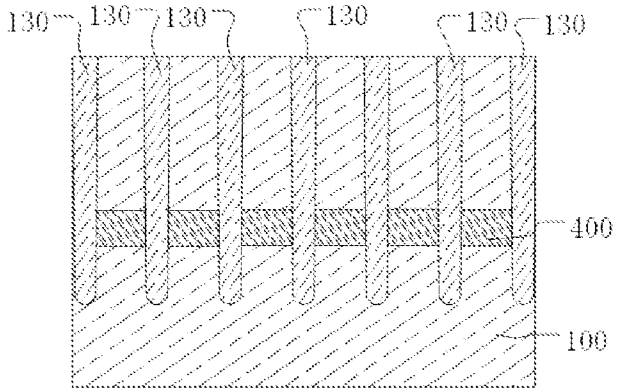
FIG. 11*c* is a cross-sectional view of forming the second isolation layer taken along C-C in FIG. 6.
Figure 11D:
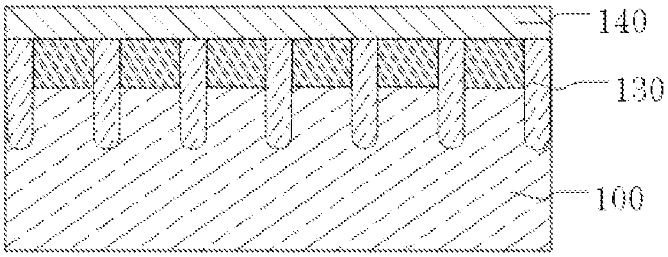
FIG. 11*d* is a cross-sectional view of forming the second isolation layer taken along D-D in FIG. 6.
Figure 12A:
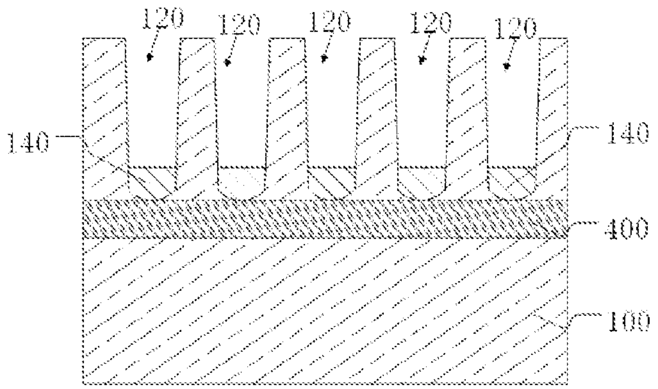
FIG. 12*a* is a cross-sectional view of etching back the first isolation layer taken along A-A in FIG. 6.
Figure 12B:
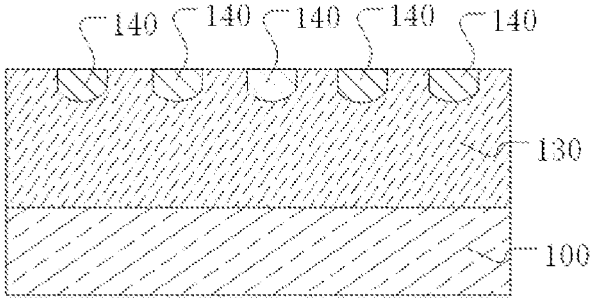
FIG. 12*b* is a cross-sectional view of etching back the first isolation layer taken along B-B in FIG. 6.
Figure 12C:
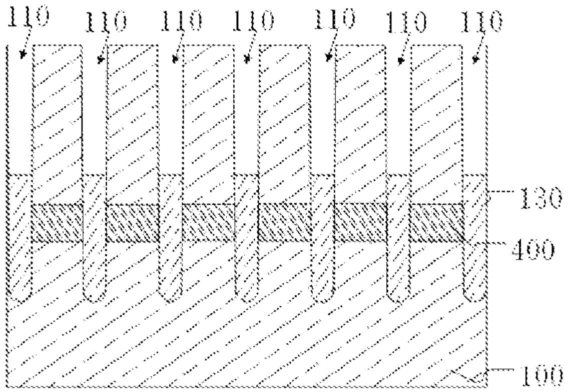
FIG. 12*c* is a cross-sectional view of etching back the first isolation layer taken along C-C in FIG. 6.
Figure 12D:
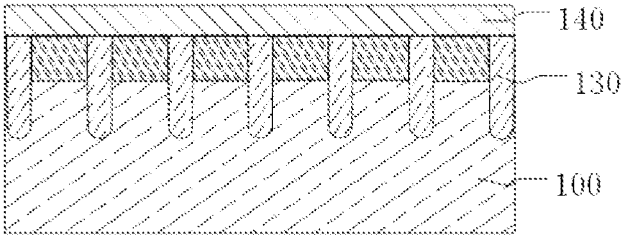
FIG. 12*d* is a cross-sectional view of etching back the first isolation layer taken along D-D in FIG. 6.
Figure 13A:
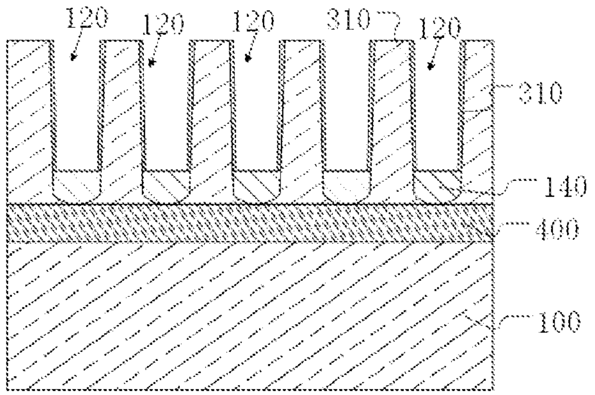
FIG. 13*a* is a cross-sectional view of forming a dielectric layer on an exposed sidewall of the active pillar taken along A-A in FIG. 6.
Figure 13B:
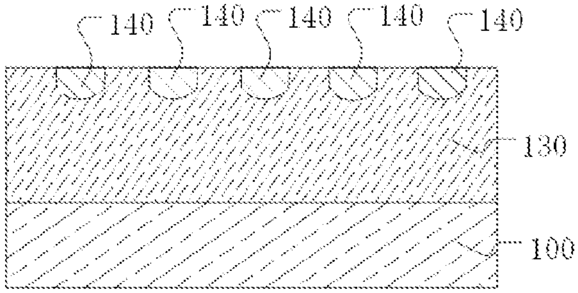
FIG. 13*b* is a cross-sectional view of forming the dielectric layer on the exposed sidewall of the active pillar taken along B-B in FIG. 6.
Figure 13C:
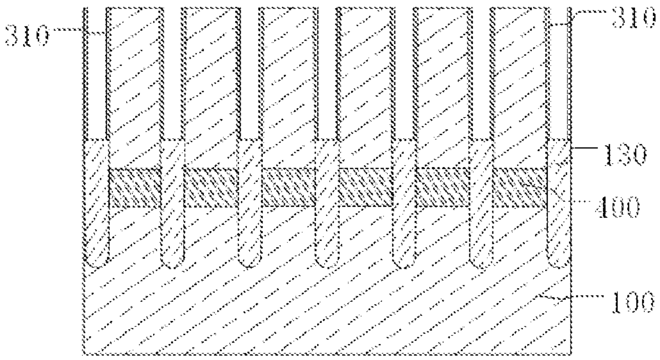
FIG. 13*c* is a cross-sectional view of forming the dielectric layer on the exposed sidewall of the active pillar taken along C-C in FIG. 6.
Figure 13D:
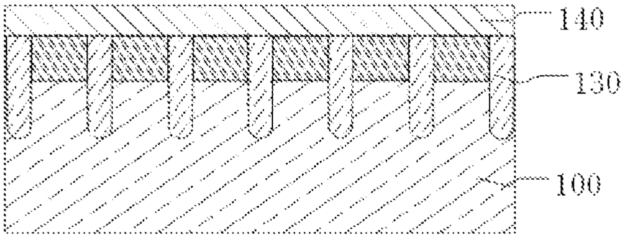
FIG. 13*d* is a cross-sectional view of forming the dielectric layer on the exposed sidewall of the active pillar taken along D-D in FIG. 6.
Figure 14A:
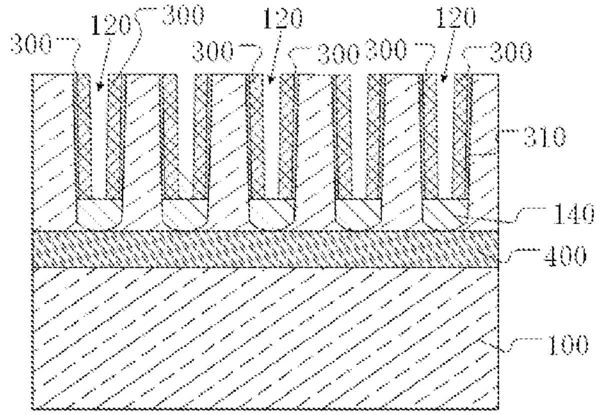
FIG. 14*a* is a cross-sectional view of forming the word line taken along A-A in FIG. 6.
Figure 14B:
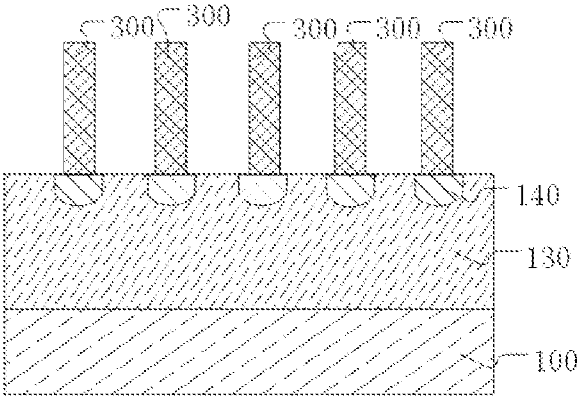
FIG. 14*b* is a cross-sectional view of forming the word line taken along B-B in FIG. 6.
Figure 14C:
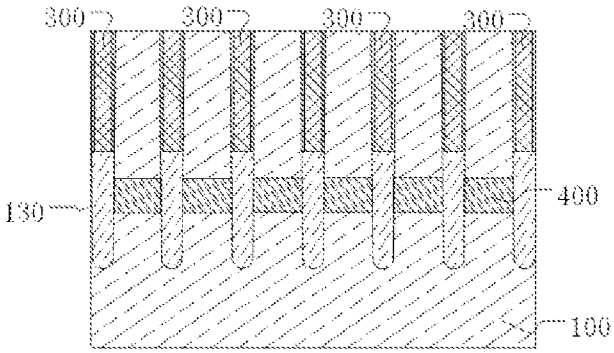
FIG. 14*c* is a cross-sectional view of forming the word line taken along C-C in FIG. 6.
Figure 14D:
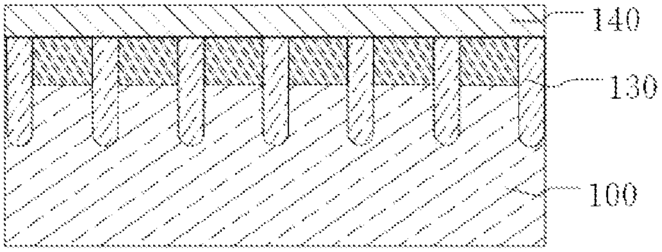
FIG. 14*d* is a cross-sectional view of forming the word line taken along D-D in FIG. 6.
Figure 15A:
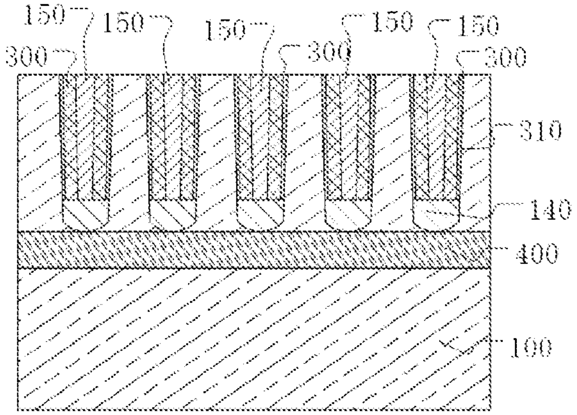
FIG. 15*a* is a cross-sectional view of forming a third isolation layer taken along A-A in FIG. 6.
Figure 15B:
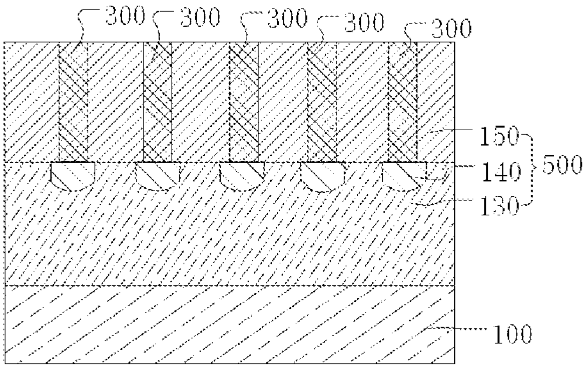
FIG. 15*b* is a cross-sectional view of forming the third isolation layer taken along B-B in FIG. 6.
Figure 15C:
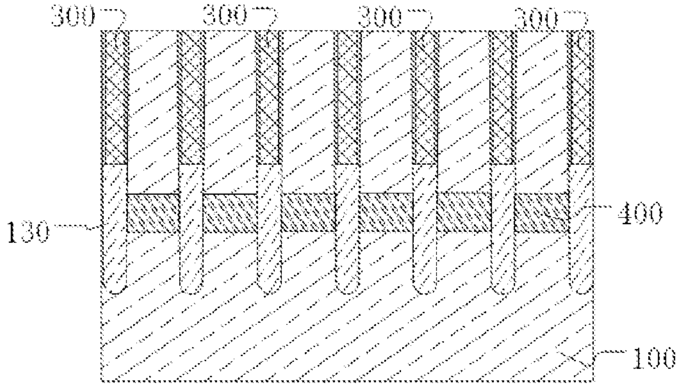
FIG. 15*c* is a cross-sectional view of forming the third isolation layer taken along C-C in FIG. 6.
Figure 15D:
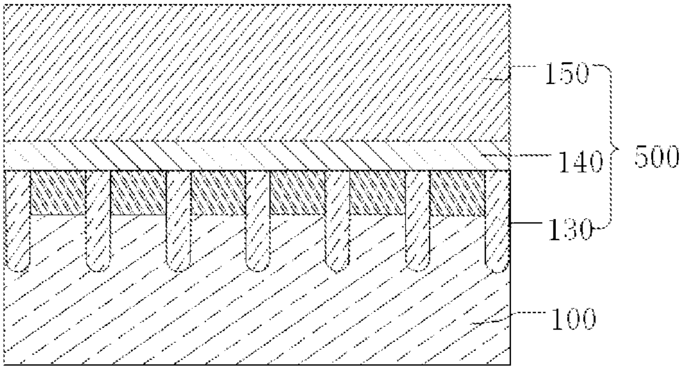
FIG. 15*d* is a cross-sectional view of forming the third isolation layer taken along D-D in FIG. 6.
Figure 16A:
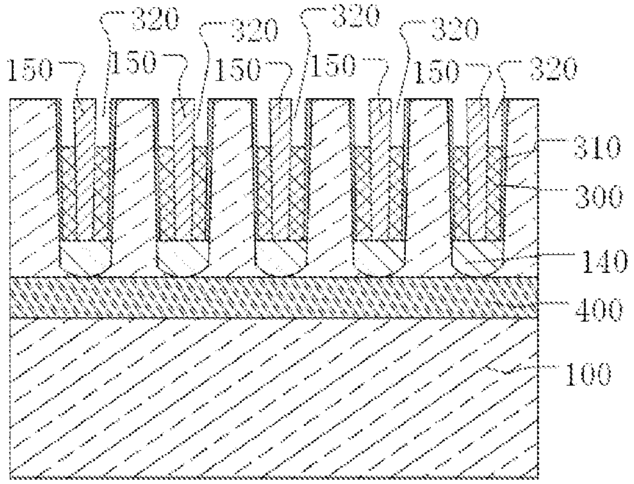
FIG. 16*a* is a cross-sectional view of forming a groove taken along A-A in FIG. 6.
Figure 16B:
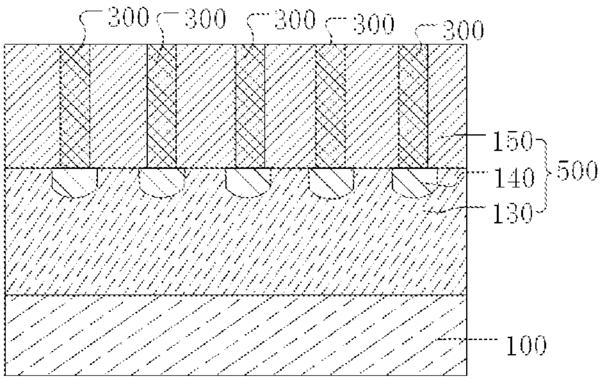
FIG. 16*b* is a cross-sectional view of forming the groove taken along B-B in FIG. 6.
Figure 16C:
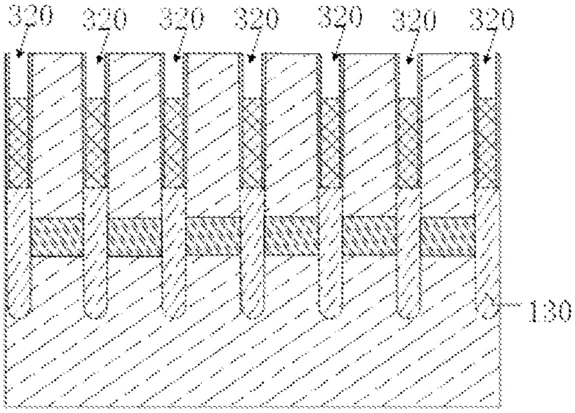
FIG. 16*c* is a cross-sectional view of forming the groove taken along C-C in FIG. 6.
Figure 16D:
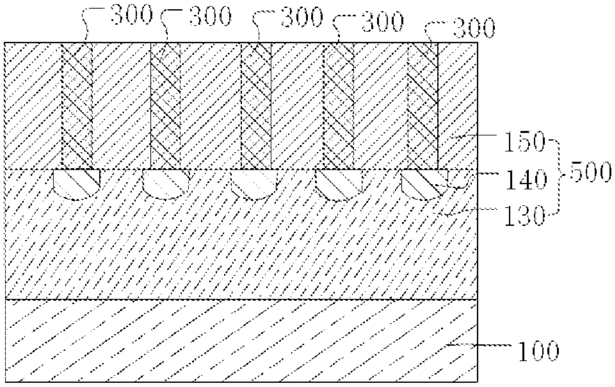
FIG. 16*d* is a cross-sectional view of forming the groove taken along D-D in FIG. 6.

As shown in FIG. 6, the first trenches 110 extend along the first direction D1 and are arranged at intervals. The second trenches 120 extend along a second direction D2, and are arranged at intervals. The first direction D1 and the second direction D2 form a predetermined angle to intersect. The active pillars 200 are disposed at intersections between two adjacent first trenches 110 and between two adjacent second trenches 120. The plurality of active pillars 200 are arranged in an array. The position of the word line 300 is defined by using the first trench 110 and the second trench 120 to self-align the word lines, such that when formed finally in the first trench 110 and the second trench 120, the isolation structure 500 can be used to self-align the word lines.

For example, the predetermined angle may be an acute angle, a right angle, or an obtuse angle. In this embodiment, the first direction D1 is perpendicular to the second direction D2. In this case, the plurality of active pillars 200 in this embodiment are arranged in a matrix.

As shown in FIG. 6, the plurality of active pillars 200 form a plurality of columns along the first direction D1. Two adjacent rows of active pillars 200 are separated by the first trenches 110. The plurality of active pillars 200 form a plurality of rows along the second direction D2. Two adjacent rows of active pillars 200 are separated by the second trenches 120. The second trench 120 is wider than the first trench 110, that is, the spacing between two adjacent rows of active pillars 200 is larger than that between two adjacent columns of active pillars 200. The first trench 110 is etched deeper than the second trench 120, such that the bit line 400 formed subsequently is located below the word line 300.

In this embodiment, with reference to FIGS. 12*a* to 12*d*, the first trench 110 and the second trench 120 are partially filled, and the structure filling the first trench 110 and the second trench 120 also partially covers the active pillar 200, such that the active pillar 200 is partially exposed in the first trench in the first trench 110 or the second trench 120.

Step S120: Form a dielectric layer, where the dielectric layer is disposed around a circumference of the active pillar.

As shown in FIGS. 13*a* to 13*d*, an atomic layer deposition (ALD) process or a chemical vapor deposition (CVD) process may be used to deposit the dielectric material. The dielectric material covers the sidewalls of the active pillar 200 exposed by the first trench 110 and the second trench 120. The dielectric layer 310 may be made of silicon oxide and/or silicon oxynitride.

Step S130: Form a word line extending along an extension direction of the second trench, where the word line covers the dielectric layer, and fills a part of the first trench located between adjacent active pillars.

As shown in FIGS. 14*a* to 14*d*, with reference to FIGS. 13*a* to 13*d*, in this embodiment, a conductive material fills the unfilled first trench 110 and the second trench 120. Because the second trench 120 is wider than the first trench 110, at a same filling speed, when the first trench 110 between adjacent active pillars 200 is filled up, the second trench 120 between adjacent active pillars 200 is only filled partially with the conductive material, and a partial region of the second trench 120 is not filled with the conductive material. In other words, in the array formed by the active pillars 200, when the first trench 110 between two adjacent active pillars 200 in each row of the active pillars 200 is filled up with the conductive material, the second trench 120 between two adjacent active pillars 200 in each column of active pillars 200 is not filled up. After the conductive material fills up the first trenches 110 located between two adjacent columns of the active pillars 200, the conductive material located between two adjacent rows of active pillars 200 is removed to form the plurality of word lines 300 arranged at intervals. Each word line 300 partially covers the sidewalls of a row of active pillars 200. The dielectric layer 310 is disposed between the word line 300 and the active pillar 200.

In the method of manufacturing a semiconductor structure in this embodiment, word lines are formed and separated through self-alignment without a photo-etching process. This embodiment has a lower process requirement, reduces process steps, and saves production costs.

According to an exemplary embodiment, this embodiment is a description of forming the word line extending along the extension direction of the second trench in step S130 of the foregoing embodiment.

Figure 4:
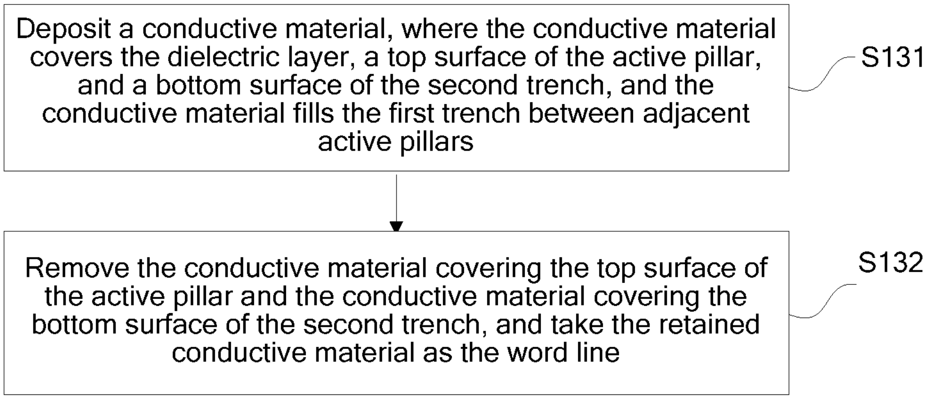
FIG. 4 is a flowchart of forming a word line in the method of manufacturing a semiconductor structure according to an exemplary embodiment.

As shown in FIG. 4, the process of forming the word line includes:

Step S131: Deposit a conductive material, where the conductive material covers the dielectric layer, a top surface of the active pillar, and a bottom surface of the second trench, and the conductive material fills the first trench between adjacent active pillars.

In some embodiments, the depositing a conductive material includes: alternately feeding a first precursor and a second precursor into a reaction chamber by pulses, where the first precursor and the second precursor are chemically adsorbed on the dielectric layer, the top surface of the active pillar, the bottom surface of the second trench, and the first trench between adjacent active pillars, and the first precursor and the second precursor chemically react to form the conductive material. The conductive material is deposited on the sidewalls and top surfaces of the active pillars 200 and fills the first trench 110 and the second trench 120 until the conductive material fills up the first trench 110 between two adjacent active pillars 200 in a same row. Because the second trench 120 is wider than the first trench 110, the conductive material fills the first trench 110 faster than the second trench 120. As a result, when the conductive material fills up the first trench 110, only a thin layer is formed on the surface of the second trench 120. The conductive material at the bottom of the second trench 120 is removed through etching back, and only the conductive material on the sidewall is retained. In this way, the formed conductive material continuously extends in the first trenches 110, and surrounds and covers the sidewalls of the active pillars 200 partially. In addition, the conductive material is discontinuous in the second trenches 120, and is separated by the third isolation layer 150 or the isolation structure 500 formed subsequently.

Chemisorption is to transfer, exchange, or share electrons between adsorbate molecules and solid surface atoms (or molecules), to form an adsorption chemical bond. Due to the uneven force field on the solid surface, the atoms on the surface often have a residual bonding ability. When the gas molecules collide with the solid surface, they exchange, transfer, or share electrons with the surface atoms, performing the function of adsorbing chemical bonds.

In some embodiments, the first precursor includes a transition metal and/or a transition metal compound. The transition metal is one or more selected from the group consisting of titanium (Ti), tantalum (Ta), cobalt (Co), nickel (Ni), and tungsten (W).

For example, the first precursor may include one or more selected from the group consisting of Ti, Ta, Co, Ni, W, and hafnium (Hf).

For example, the first precursor may further include one or more oxides selected from the group consisting of Ti, Ta, Co, Ni, W, and Hf. For example, the first precursor may include titanium dioxide ($TiO_2$), tantalic oxide ($Ta_2O_5$), cobaltous oxide (CoO), nickel (II) oxide (NiO), tungsten trioxide ($WO_3$), hafnium (IV) oxide ($HfO_2$), and the like.

For example, the first precursor may further include one or more halides selected from the group consisting of Ti, Ta, Co, Ni, W, and Hf. For example, the first precursor may include titanium tetrachloride ($TiCl_4$), tantalic chloride ($TaCl_5$), cobaltous chloride ($CoCl_2$), nickel chloride ($NiCl_2$), tungsten (VI) chloride ($WCl_6$), Hafnium (IV) chloride ($HfCl_4$).

In some embodiments, the second precursor is a vapor precursor, and includes a nitrogen source gas. For example, the second precursor may be ammonia ($NH_3$), nitrogen ($N_2$), and melamine ($C_3H_6N_6$).

In some embodiments, the conductive material may be reactively deposited through an ALD process. The ALD process can control the thickness of the conductive material formed through deposition more precisely, to make a layer formed by the conductive material in the second trench 120 thinner, reduce the difficulty of subsequently etching back the conductive material in the second trench 120, and separate the conductive material into a plurality of word lines 300 disposed independently.

This embodiment is described below by depositing TiN as the conductive material.

$TiCl_4$ and $NH_3$ are alternatively fed into an ALD reaction chamber by pulses. $TiCl_4$ and $NH_3$ react in the reaction chamber to generate TiN. TiN is deposited on the exposed sidewall and top surface of the active pillar 200 in the semiconductor structure and fills the first trench 110 and the second trench 120, until TiN fills up the first trench 110 between two adjacent active pillars 200 in a same row, and forms a thin layer in the second trenches 120 between two adjacent rows of active pillars 200.

Step S132: Remove the conductive material covering the top surface of the active pillar and the conductive material covering the bottom surface of the second trench, and take a remaining part of the conductive material as the word line.

In some embodiments, the conductive material is etched through dry etching. The dry etching is an anisotropic etching process. The height direction of the active pillar 200 is used as a vertical direction. An etching speed of the dry etching in the vertical direction is faster than that in a horizontal direction. The conductive material covering the top surface of the active pillar 200 and the thin layer formed by the conductive material in the second trench 120 are removed through the etching process, such that a remaining part of the conductive material forms a plurality of word lines 300 disposed independently. Gaps in the second trenches 120 separate two adjacent rows of word lines 300.

In this embodiment, the width difference between the second trench and the first trench is adjusted, such that at a same deposition speed, the first trench is filled at a faster rate than the second trench. The anisotropic etching process adjusts the etching speed in different directions when the conductive material is etched, to remove the conductive material in the second trenches, and form gaps in the second trenches. A remaining part of the conductive material is separated by the gaps into a plurality of word lines disposed independently. The semiconductor structure formed in this embodiment has a high yield and optimal electrical properties. In addition, this embodiment also avoids possible mistakes generated during the removal of the conductive material to isolate adjacent word lines. For example, incomplete etching causes adjacent word lines to be connected, or a light alignment error causes word lines at one side to be partially etched away. In this case, the present embodiment further reduces the production processes of forming word lines and isolating word lines, reduces production costs, can further integrate the semiconductor structure, and is especially beneficial to miniaturizing the size of the gate-all-around (GAA) semiconductor structure.

Figure 5:
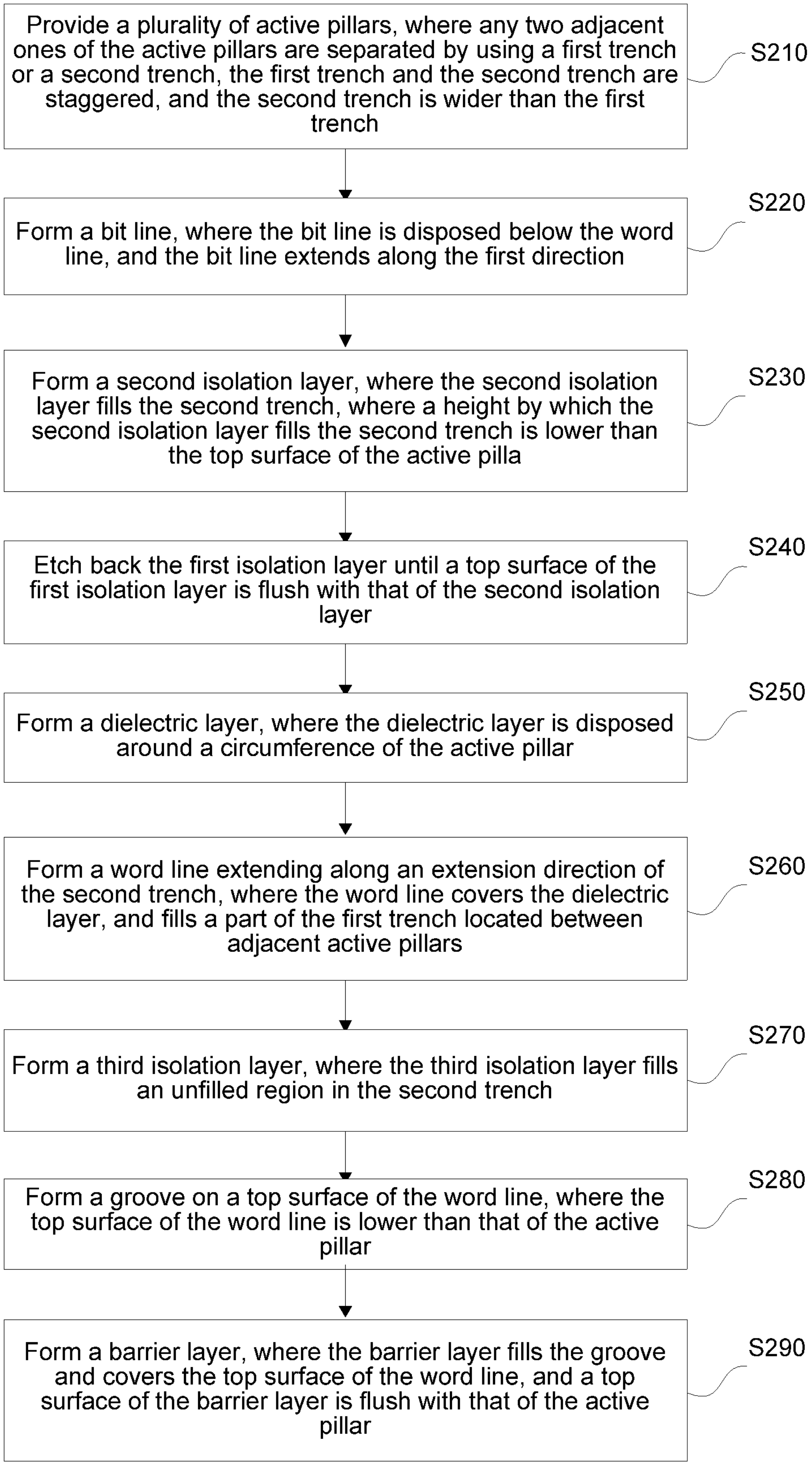
FIG. 5 is a flowchart of the method of manufacturing a semiconductor structure according to an exemplary embodiment.

As shown in FIG. 5, an exemplary embodiment of the present disclosure provides a method of manufacturing a semiconductor structure, including:

step S210: Provide a plurality of active pillars, where any two adjacent ones of the active pillars are separated by using a first trench or a second trench, the first trench and the second trench are staggered, and the second trench is wider than the first trench.

In this embodiment, the providing the plurality of active pillars includes:

Step S211: Provide a substrate.

The substrate 100 may be made of a semiconductor material. The semiconductor material may be one or more selected from the group consisting of silicon, germanium, a silicon germanium compound, and a silicon carbon compound. The semiconductor material may be an intrinsic semiconductor or a semiconductor dopant material that is lightly doped with ions.

Step S212: Form first trenches extending along a first direction in the substrate, where the first trenches are arranged in parallel at an equal interval in a second direction, and the first direction and the second direction intersect.

As shown in FIGS. 7*a* to 7*d*, a part of the substrate 100 is removed. A plurality of first trenches 110 are formed in the substrate 100. Each of the first trenches 110 extends along the first direction D1. The plurality of first trenches 110 are arranged at intervals.

Step S213: Form a first isolation layer, where the first isolation layer fills the first trench.

As shown in FIGS. 8*a* to 8*d*, with reference to FIGS. 7*a* to 7*d*, a first isolation layer 130 is formed by filling the first trench 110 with an isolation material. The isolation material may be selected from the group consisting of silicon oxide, silicon nitride, or silicon oxynitride.

Step S214: Remove a part of the substrate and a part of the first isolation layer, to form second trenches extending along the second direction, where the second trenches are arranged in parallel at an equal interval in the first direction, and the first trenches and the second trenches separate a remaining part of the substrate into the plurality of active pillars disposed independently.

As shown in FIGS. 9*a* to 9*d*, with reference to FIGS. 8*a* to 8*d*, a part of the substrate 100 and a part of the first isolation layer 130 are removed. A plurality of second trenches 120 are formed in the substrate 100 and the first isolation layer 130. Each of the second trenches 120 extends along the second direction D2. The plurality of the second trenches 120 are arranged at intervals. The second trench 120 is wider than the first trench 110. The plurality of first trenches 110 are arranged in parallel. The plurality of second trenches 120 are arranged in parallel. The plurality of first trenches 110 and the plurality of second trenches 120 intersect each other. The remaining structure on the substrate 100 is divided into a plurality of active pillars 200 independent of each other. In some embodiments, the first direction D1 and the second direction D2 are perpendicular to each other. A plurality of independently disposed active pillars 200 are arranged in a matrix.

Step S220: Form a bit line, where the bit line is disposed below the word line, and the bit line extends along the first direction.

In some embodiments, the first trench 110 is deeper than the second trench 120. As shown in FIGS. 10*a* to 10*d*, with reference to FIGS. 9*a* to 9*d*, the bit line 400 is formed between first trenches 110. The bit line 400 is disposed at the bottom of each of the active pillars 200.

In some embodiments, forming the bit line 400 includes forming a metal silicide. For example, an oxide layer may be formed on the sidewall of the active pillar 200 through a thermal oxidation process. The oxide layer covering the bottom wall of the second trench 120 is removed. A metal layer is formed on the substrate 100 under the second trench 120. Moreover, in the thermal process steps, a plurality of bit lines 400 are formed below the active pillars 200. The plurality of bit lines 400 are correspondingly disposed below the plurality of columns of active pillars 200 arranged along the first direction D1. Adjacent bit lines 400 are separated by a gap in the first trench 110.

In some embodiments, after the bit line 400 is formed, the method further includes: implanting ions into the active pillars 200 above the bit lines 400, and implanting ions into both sides of each of the active pillars 200, where a source region and a drain region are respectively formed at two sides of each of the active pillars 200, and a channel region is formed between the source region and the drain region.

Step S230: Form a second isolation layer, where the second isolation layer fills the second trench, where a height by which the second isolation layer fills the second trench is lower than the top surface of the active pillar.

As shown in FIGS. 11*a* to 11*d*, with reference to FIGS. 10*a* to 10*d*, the isolation material is deposited. The isolation material fills a part of the second trench 120 to form the second isolation layer 140. That is, the second isolation layer 140 partially covers the sidewall of the active pillar 200. In some embodiments, the second isolation layer 140 covers the source region or the drain region.

In some embodiments, the second isolation layer 140 may be made of silicon oxide, silicon nitride, or silicon oxynitride. It should be noted that the etching properties of the material of the second isolation layer 140 and that of the first isolation layer 130 are different, such that when the first isolation layer 130 is etched to form the space of the self-aligned word line, the second isolation layer 140 may serve as an etching stop layer.

Step S240: Etch back the first isolation layer until a top surface of the first isolation layer is flush with that of the second isolation layer.

As shown in FIGS. 12*a* to 12*d*, with reference to FIGS. 11*a* to 11*d*, the second isolation layer 140 is used as an etching stop layer to etch back the first isolation layer 130 and expose a part of the sidewall of the active pillar 200.

Step S250: Form a dielectric layer, where the dielectric layer is disposed around a circumference of the active pillar.

The implementation of step S250 in this embodiment is the same as that of step S120 in the foregoing embodiment. Details are not described herein again.

Step S260: Form a word line extending along an extension direction of the second trench, where the word line covers the dielectric layer, and fills a part of the first trench located between adjacent active pillars.

The implementation of step S260 in this embodiment is the same as that of step S130 in the foregoing embodiment. Details are not described herein again.

Step S270: Form a third isolation layer, where the third isolation layer fills an unfilled region in the second trench.

As shown in FIGS. 15*a* to 15*d*, with reference to FIGS. 14*a* to 14*d*, an isolation material is deposited. The isolation material fills a gap between adjacent word lines 300 and the remaining unfilled region of the second trench 120, to form a third isolation layer 150. The third isolation layer 150 may be made of silicon oxide, silicon nitride, or silicon oxynitride. The retained first isolation layer 130, the retained second isolation layer 140, and the third isolation layer 150 form an isolation structure 500.

Step S280: Form a groove on a top surface of the word line, where the top surface of the word line is lower than that of the active pillar.

As shown in FIGS. 16*a* to 16*d*, with reference to FIGS. 15*a* to 15*d*, a part of the conductive material is removed through a dry etching process, a wet etching process, or a back etching process, to form the groove 320 on the top surface of the word line 300, such that the top surface of the word line 300 is lower than that of the active pillar 200.

Step S290: Form a barrier layer, where the barrier layer fills the groove and covers the top surface of the word line, and a top surface of the barrier layer is flush with that of the active pillar.

The structure formed in this embodiment is shown in FIGS. 1*a* to 1*d*. The barrier layer covers the top surface of the word line 300 and fills the groove 320. A barrier structure 330 is formed in the groove 320. The top surface of the barrier structure 330 is flush with that of the third isolation layer 150.

In the semiconductor structure of this embodiment, the top surface of the word line is lower than that of the active pillar, to avoid that an extremely small spacing between adjacent word lines causes the word line to be electrically connected to the top surface of the semiconductor structure, resulting a short circuit, thereby ensuring the electrical performance of the semiconductor structure.

In the semiconductor structure and the manufacturing method thereof of this embodiment, the deposited conductive material is self-aligned by adjusting widths of the first trench and the second trench, such that the first trench and the second trench are filled at different speeds, without metal filling first. Then, adjacent word lines are isolated through etching to form a plurality of word lines disposed independently. The method of the embodiments of the present disclosure can not only miniaturize the size of the semiconductor device such as a GAA semiconductor structure, but also self-align word lines and isolate word lines without a photoetching process such as an EUV etching process, and further resolve the problem that because an isolated part between word lines is not etched away, a word line material at one side is etched completely, or because the etching is not through, adjacent word lines are connected. Therefore, the present disclosure provides a basis for the development and mass production of semiconductor structures in the direction of miniaturization.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In a semiconductor structure and a manufacturing method thereof provided in embodiments of the present disclosure, a second trench of the semiconductor structure is wider than the first trench, two adjacent word lines are separated, to complete a structure of the word lines, and adjacent word lines are not conductively connected, improving the yield and reliability of semiconductor structure. In the manufacturing method provided by the embodiments of the present disclosure, the word lines are formed and separated through self-alignment without a photo-etching process. This embodiment has a lower process requirement, reduces process steps, and saves production costs.

The invention claimed is:

1. A method of manufacturing a semiconductor structure, comprises:

providing a plurality of active pillars, wherein any two adjacent ones of the plurality of active pillars are separated by using a first trench or a second trench, the first trench and the second trench are staggered, and the second trench is wider than the first trench;

forming a dielectric layer, wherein the dielectric layer is disposed around a circumference of the active pillar; and forming a word line extending along an extension direction of the second trench, wherein the word line covers the dielectric layer, and fills a part of the first trench located between adjacent active pillars, wherein the forming a word line comprises: depositing a conductive material, wherein the conductive material covers the dielectric layer, a top surface of the active pillar, and a bottom surface of the second trench, and the conductive material fills the first trench between adjacent active pillars; and removing the conductive material covering the top surface of the active pillar and the conductive material covering the bottom surface of the second trench, and taking a remaining part of the conductive material as the word line.

2. The method of manufacturing a semiconductor structure according to claim 1, wherein the depositing a conductive material comprises:

alternately feeding a first precursor and a second precursor into a reaction chamber by pulses, wherein the first precursor and the second precursor are chemically adsorbed on the dielectric layer, the top surface of the active pillar, the bottom surface of the second trench, and the first trench between adjacent active pillars, and the first precursor and the second precursor react to form the conductive material.

3. The method of manufacturing a semiconductor structure according to claim 2, wherein the first precursor comprises a transition metal and/or a transition metal compound.

4. The method of manufacturing a semiconductor structure according to claim 2, wherein the second precursor is a vapor precursor, and comprises a nitrogen source gas.

5. The method of manufacturing a semiconductor structure according to claim 1, wherein the providing a plurality of active pillars comprises:

providing a substrate;

forming first trenches extending along a first direction in the substrate, wherein the first trenches are arranged in parallel at an equal interval in a second direction, and the first direction and the second direction intersect;

forming a first isolation layer, wherein the first isolation layer fills the first trench; and removing a part of the substrate and a part of the first isolation layer, and forming second trenches extending along the second direction, wherein the second trenches are arranged in parallel at an equal interval in the first direction, and the first trenches and the second trenches separate a remaining part of the substrate into the plurality of active pillars disposed independently.

6. The method of manufacturing a semiconductor structure according to claim 5, wherein the first trench is etched deeper than the second trench.

7. The method of manufacturing a semiconductor structure according to claim 5, further comprising:

forming a bit line, wherein the bit line is disposed below the word line, and the bit line extends along the first direction.

8. The method of manufacturing a semiconductor structure according to claim 5, further comprising:

forming a second isolation layer, the second isolation layer filling the second trench, wherein a height by which the second isolation layer fills the second trench is lower than a top surface of the active pillar.

9. The method of manufacturing a semiconductor structure according to claim 8, further comprising:

etching back the first isolation layer until a top surface of the first isolation layer is flush with a top surface of the second isolation layer.

10. The method of manufacturing a semiconductor structure according to claim 8, further comprising:

forming a third isolation layer, wherein the third isolation layer fills an unfilled region in the second trench.

11. The method of manufacturing a semiconductor structure according to claim 1, further comprising:

forming a groove on a top surface of the word line, wherein the top surface of the word line is lower than the top surface of the active pillar; and forming a barrier layer, wherein the barrier layer fills the groove and covers the top surface of the word line, and a top surface of the barrier layer is flush with the top surface of the active pillar.

* * * * *